US012598813B2

(12) United States Patent
Shi et al.

(10) Patent No.: US 12,598,813 B2
(45) Date of Patent: Apr. 7, 2026

(54) TVS WITH ENHANCED REPETITIVE SURGE PERFORMANCE

(71) Applicant: Littelfuse Semiconductor (Wuxi) Co., Ltd., Wuxi (CN)

(72) Inventors: Lei Shi, Wuxi (CN); Jifeng Zhou, Wuxi (CN); Xingchong Gu, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 403 days.

(21) Appl. No.: 18/368,829

(22) Filed: Sep. 15, 2023

(65) Prior Publication Data

US 2024/0096869 A1    Mar. 21, 2024

(30) Foreign Application Priority Data

Sep. 16, 2022    (CN) .......................... 202222455803.9

(51) Int. Cl.
H10D 89/60        (2025.01)
H10D 62/10        (2025.01)
(52) U.S. Cl.
CPC ........... H10D 89/60 (2025.01); H10D 62/113 (2025.01)
(58) Field of Classification Search
CPC ...... H10D 89/60; H10D 62/113; H10D 8/422; H10D 62/83; H10D 64/62; H10D 62/104; H10D 62/124; H10D 8/041; H10D 8/045; H10D 89/611; H10D 8/00; Y02P 70/50
See application file for complete search history.

(56) References Cited

U.S. PATENT DOCUMENTS

2009/0250720 A1    10/2009  Saucedo-Flores
2011/0147713 A1*    6/2011  Pillarisetty ......... H10D 62/8164
                                                            438/270
2012/0098036 A1*    4/2012  Bahl .................... H10D 30/015
                                                            257/E21.403

FOREIGN PATENT DOCUMENTS

CN        109166908 A        1/2019
CN        114171416 A        3/2022

OTHER PUBLICATIONS

European Search Report for EP Application No. 23195224.3, dated Feb. 16, 2024, 10 pages.

* cited by examiner

*Primary Examiner* — Mohammad A Rahman
(74) *Attorney, Agent, or Firm* — KDW Firm PLLC

(57) ABSTRACT

A transient voltage suppression (TVS) device. The TVS device may include a substrate, comprising a polarity of a first type. The TVS device may further include a first dopant layer, disposed on a first surface of the substrate, the first layer comprising a polarity of a second type, wherein the first dopant layer forms a P/N junction with the substrate. The TVS device may include a first buffer layer, disposed on the first dopant layer, and a first outer contact layer, disposed on the first buffer layer.

8 Claims, 1 Drawing Sheet

100

150

TVS WITH ENHANCED REPETITIVE SURGE PERFORMANCE

BACKGROUND

Field

Embodiments relate to the field of circuit protection devices, including transient voltage suppressor devices.

Discussion of Related Art

Semiconductor devices such as transient voltage suppressor (TVS) devices may be fabricated as unidirectional devices or bidirectional devices. In many applications, TVS diodes may be used to protect the sensitive circuit nodes against one-time and time-limited overvoltage faults. Such TVS diodes are also used in modern high power IGBT circuits to protect against overload in the collector circuit. The requirements for such TVS diodes may include a high breakdown voltage, with low deviation and low temperature coefficient, as well as a high surge current capability, with a low clamping voltage. Moreover, in many applications TVS devices may be designed to protect against repetitive surge events, rendering the TVS devices susceptible to degradation after repetitive surge events. As an example, the TVS device metal contact may tend to degrade due to heating in a surge event, which heating may be non-uniform and may lead to defects that cause device failure.

With respect to these and other considerations, the present disclosure is provided.

SUMMARY

In one embodiment, a transient voltage suppression (TVS) device may include a substrate, comprising a polarity of a first type. The TVS device may further include a first dopant layer, disposed on a first surface of the substrate, the first layer comprising a polarity of a second type, wherein the first dopant layer forms a P/N junction with the substrate. The TVS device may include a first buffer layer, disposed on the first dopant layer, and a first outer contact layer, disposed on the first buffer layer.

In a further embodiment, a bidirectional transient voltage suppression (TVS) device may include a substrate, comprising a polarity of a first type, and a first dopant layer, disposed on a first surface of the substrate, the first layer comprising a polarity of a second type, wherein the first dopant layer forms a P/N junction with the substrate. The bidirectional TVS device may also include a first buffer layer, disposed on the first dopant layer, a first outer contact layer, disposed on the first buffer layer, and a second dopant layer, disposed on a second surface of the substrate, opposite to the first surface, the second dopant layer comprising the polarity of the second type. The bidirectional TVS device may also include a second buffer layer, disposed on the second dopant layer, and a second outer contact layer, disposed on the second buffer layer.

In a further embodiment, a semiconductor device may include a substrate, comprising a polarity of a first type and a first dopant layer, disposed on a first surface of the substrate, the first layer comprising a polarity of a second type, wherein the first dopant layer forms a P/N junction with the substrate. The semiconductor device may include a first buffer layer, disposed on the first dopant layer, and a first outer contact layer, disposed on the first buffer layer, wherein the first buffer layer comprises an aluminum metal layer having a thickness between two micrometers and ten micrometers.

DESCRIPTION OF EMBODIMENTS

Figures 1A, 1B:
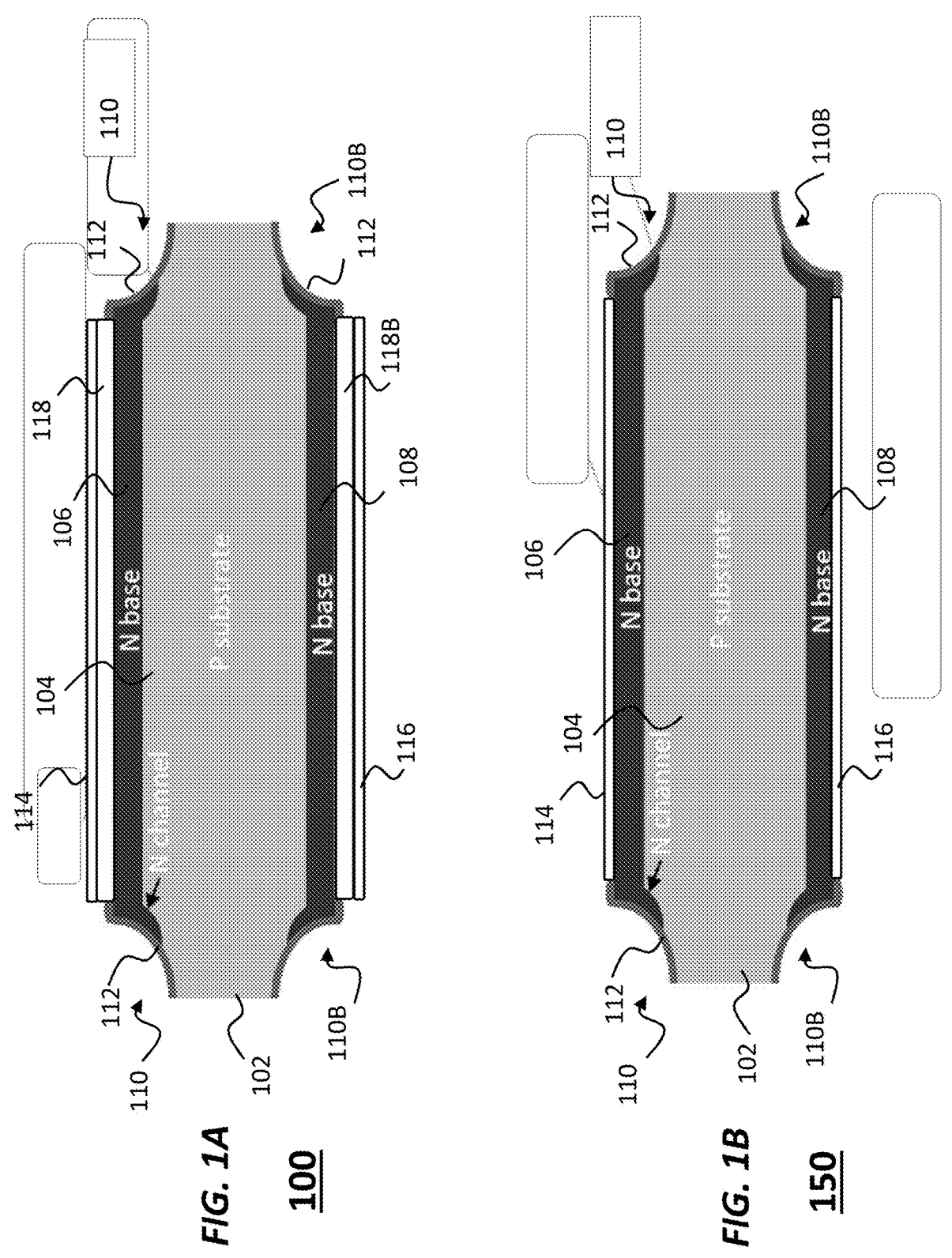
FIG. 1A illustrates a TVS device according to embodiments of the disclosure.
FIG. 1B illustrates a reference TVS device.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements.

In various embodiments, novel device structures and are provided for forming a bidirectional or unidirectional TVS device with improved surge capability.

FIG. 1A illustrates one implementation of a TVS device 100. The TVS device 100 may be formed in a monolithic semiconductor substrate, such as silicon. As such, the semiconductor substrate, shown as substrate 102, may be formed of a polarity of a first type. In the example shown, the semiconductor substrate may be a P-type substrate having a dopant concentration in the range of $1E16/cm^3$ to $8E19/cm^3$.

The TVS device 100 further includes a first dopant layer 106, where the dopant is of a second dopant type, opposite the first dopant type of the substrate 102. In this case the first dopant layer 106 is shown as N base layer, disposed on a P-type substrate. The concentration of the first dopant layer 106 may be in a range of $1E17/cm^3$ to $2E21/cm^3$. The thickness of the first dopant layer 106 may be in a range of 1 μm~100 μm.

The TVS device 100 includes a second dopant layer 108, disposed on a second surface of the substrate 102, opposite to the first surface. In this example, the second dopant layer 108 is of the polarity of the second type, namely an N-type dopant that is disposed on a P-type substrate, and shown as N base. As such, the inner region of the substrate 102 defines an inner layer 104 between the first dopant layer 106 and second dopant layer 108, where the first dopant layer 106 thus forms a P/N junction with the inner layer 104 of the substrate 102, and the second dopant layer 108 forms an additional P/N junction with the inner layer 104.

The TVS device 100 thus forms a bidirectional device, as known in the art. Note that while the TVS device 100 is based upon a P-type substrate, in other embodiments of the disclosure, a TVS device may have an N-type substrate with P-type first dopant layer and second dopant layer, disposed on opposite surfaces. Moreover, while the TVS device 100 shows a bidirectional device, the present embodiments extend to unidirectional devices, where a single dopant layer, such as the first dopant layer 106, is used to form a single P/N junction.

In the TVS device 100 an isolation structure 110 is provided, where the isolation structure 110 extends around a periphery of the first dopant layer 106, and into a region of the substrate 102 having the polarity of the first type, meaning into the inner layer 104. In various embodiments, the isolation structure 110 may be mesa isolation structure (as generally depicted in FIG. 1A), a planar isolation structure, or other isolation structure. In this embodiment, the isolation structure 110 includes an insulator layer 112, such as an oxide glass layer.

In the TVS device 100 an additional isolation structure, shown as isolation structure 110B is provided, where the isolation structure 110B extends around a periphery of the second dopant layer 108, and into the inner layer 104. In various embodiments, the isolation structure 110B may be mesa isolation structure (as generally depicted in FIG. 1A), a planar isolation structure, or other isolation structure. In this embodiment, the isolation structure 110B includes an insulator layer 112, such as an oxide glass layer.

A defining feature of the TVS device 100 is the presence of a buffer layer that acts as a thermal spreading layer and mechanical stress buffer layer. For conciseness, this layer may be referred to hereinafter as a buffer layer. In FIG. 1A, one example of a buffer layer is shown as first buffer layer 118, which layer is disposed on the first dopant layer 106. A first outer contact layer 114 is disposed on the first buffer layer 118.

In the embodiment of FIG. 1A, the TVS device 100 includes a second buffer layer, shown as second buffer layer 118B, which layer is disposed on the second dopant layer 108. A second outer contact layer 116 is disposed on the second buffer layer 118B.

In this embodiment, the first outer contact layer 114 and the second outer contact layer 116 (having a thickness of 0.1 µm to 10 µm, for example) may have the role of forming metal electrode contacts that are arranged to connect to external components, as in known TVS devices. Non-limiting examples of the first outer contact layer 114 and the second outer contact layer 116 is a nickel layer, or a combination layer including titanium, nickel and aluminum.

A novel feature of the TVS device 100 is the provision of the first buffer layer 118 and the second buffer layer 118B, where each of these layers may play the role of improving surge performance during device operation. In particular, the first buffer layer 118 or second buffer layer 118B may be a metal layer having a thickness between 2 micrometers and 10 micrometers, which layer serves to reduce failure of the TVS device 100 under repeated surge events. For example, these buffer layers (118, 118B) may be formed of an aluminum metal layer or a thick silver layer. By providing a relatively thick metal layer that acts as a thermal spreader, the current and/or heat developed during surge events may be more uniformly spread along the main plane of the substrate (horizontal plane in the figure) within the contact layer region, including the first outer contact 114 and second outer contact layer 116. In addition, because the buffer layer may be formed of a relatively softer metal such as aluminum that is softer than the silicon substrate and softer than the outer contact layers (114, 116), the buffer layers may act as a stress absorption layer when mechanical stress is introduced by thermal events. Thus, hot spots and places of local degradation and excess stress in the outer contact layers (114, 116) may be avoided by use of the buffer layers 118, 118b.

To highlight the advantages of the embodiment of the TVS device 100 of FIG. 1A, there is shown in FIG. 1B a reference TVS device, shown as TVS device 150. The TVS device 150 may have some of the same features as exhibited by the TVS device 100, where like features are labeled the same. Thus, The TVS device 150 has a first dopant type for the substrate 102, further includes a first dopant layer 106, where the dopant is of a second dopant type, opposite the first dopant type of the substrate 102. The TVS device 150 also includes a second dopant layer 108, disposed on a second surface of the substrate 102, opposite to the first surface.

Similarly to the TVS device 100, the TVS device 150 forms a bidirectional device, as known in the art. However, in this example, as in known TVS devices, the outer contact layers (114, 116) are formed directly on the first dopant layer 106 and on the second dopant layer 108, respectively.

In this configuration, without any buffer layers present below the outer contact layers (114, 116), more heat non-uniformities and current non-uniformities may develop in the outer contact layers (114,116) during surge events, leading to hot spots, excess stress and resulting degradation of the TVS contact structure, including electrical failures.

In summary, the embodiments of TVS devices discussed with respect to FIG. 1A provide configurations novel device contact structures that include a relatively thicker buffer layer at the interface between an outer contact layer and the doped substrate surface. Such novel device contact structures are suitable in different non-limiting embodiments for a TVS device, such as a bidirectional device or unidirectional device, based upon a P-type substrate or an N type substrate.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A transient voltage suppression (TVS) device, comprising:
   a substrate, comprising a polarity of a first type;
   a first dopant layer, disposed on a first surface of the substrate, the first dopant layer comprising a polarity of a second type, wherein the first dopant layer forms a P/N junction with the substrate;
   a first buffer layer, disposed on the first dopant layer;
   a first outer contact layer, disposed on the first buffer layer; and
   an isolation structure, the isolation structure extending around a periphery of the first dopant layer, and into a region of the substrate having the polarity of the first type, wherein the isolation structure comprises an oxide glass layer, disposed on an outer surface of the isolation structure.

2. The TVS device of claim 1, further comprising:
   a second dopant layer, disposed on a second surface of the substrate, opposite to the first surface, the second layer comprising the polarity of the second type;
   a second buffer layer, disposed on the second dopant layer; and a second outer contact layer, disposed on the second buffer layer.

3. The TVS device of claim 1, the buffer layer having a thickness between 2 micrometers and 10 micrometers.

4. The TVS device of claim 1, the first buffer layer comprising an aluminum layer.

5. The TVS device of claim 1, the first outer contact layer comprising a nickel layer or a combination layer including titanium, nickel and aluminum.

6. A bidirectional transient voltage suppression (TVS) device, comprising:

a substrate, comprising a polarity of a first type;

a first dopant layer, disposed on a first surface of the substrate, the first dopant layer comprising a polarity of a second type, wherein the first dopant layer forms a P/N junction with the substrate;

a first buffer layer, disposed on the first dopant layer;

a first outer contact layer, disposed on the first buffer layer;

a second dopant layer, disposed on a second surface of the substrate, opposite to the first surface, the second dopant layer comprising the polarity of the second type;

a second buffer layer, disposed on the second dopant layer; and a second outer contact layer, disposed on the second buffer layer.

7. The bidirectional TVS device of claim 6, the first buffer layer and the second buffer layer comprising a metal layer having a thickness between 2 micrometers and 10 micrometers.

8. The bidirectional TVS device of claim 7, the first buffer layer and the second buffer layer comprising an aluminum layer.

* * * * *